(12) United States Patent
Kimura

(10) Patent No.: US 11,561,293 B2
(45) Date of Patent: Jan. 24, 2023

(54) LASER RADAR DEVICE

(71) Applicant: DENSO CORPORATION, Kariya (JP)

(72) Inventor: Shunsuke Kimura, Kariya (JP)

(73) Assignee: DENSO CORPORATION, Kariya (JP)

( * ) Notice: Subject to any disclaimer, the term of this patent is extended or adjusted under 35 U.S.C. 154(b) by 389 days.

(21) Appl. No.: 16/860,701

(22) Filed: Apr. 28, 2020

(65) Prior Publication Data

US 2020/0256957 A1   Aug. 13, 2020

Related U.S. Application Data

(63) Continuation of application No. PCT/JP2018/040195, filed on Oct. 29, 2018.

(30) Foreign Application Priority Data

Oct. 30, 2017  (JP) .............................. JP2017-208986

(51) Int. Cl.

| G01S 7/489 | (2006.01) |
|---|---|
| H03G 1/00 | (2006.01) |
| G01S 17/10 | (2020.01) |
| H03K 17/687 | (2006.01) |
| H03M 1/12 | (2006.01) |
| H03G 3/00 | (2006.01) |

(52) U.S. Cl.
CPC .............. *G01S 7/489* (2013.01); *G01S 17/10* (2013.01); *H03G 1/0005* (2013.01); *H03G 3/00* (2013.01); *H03K 17/687* (2013.01); *H03M 1/12* (2013.01)

(58) Field of Classification Search
None
See application file for complete search history.

(56) References Cited

U.S. PATENT DOCUMENTS

| 2005/0082500 A1 | 4/2005 | Yamaguchi |
| 2016/0274246 A1 | 9/2016 | Kimura et al. |
| 2020/0256962 A1* | 8/2020 | Kimura ................. G01S 7/4861 |

FOREIGN PATENT DOCUMENTS

| JP | S54-072059 A | 5/1979 |
| JP | H05-063572 A | 3/1993 |
| JP | H07-58562 A | 3/1995 |
| JP | 2016-014535 A | 1/2016 |
| JP | 2016-178432 A | 10/2016 |

* cited by examiner

*Primary Examiner* — Kenneth B Wells
(74) *Attorney, Agent, or Firm* — Maschoff Brennan

(57) ABSTRACT

A light receiving unit receives a pulsed optical signal arriving from a search region. A branching unit generates, from a received light signal, a plurality of branch signals having signal intensities proportional to a signal intensity of the received light signal and different from one another. A conversion unit converts, from analog to digital, a signal fed via the individual path selected by a selection unit, and in accordance with a result of the conversion, a processing unit generates information regarding an object reflecting the optical signal. A control unit causes the selection unit to select one of the individual paths for which a determination unit determines that a magnitude of the fed signal is within an input range of the conversion unit and which provides the highest gain.

12 Claims, 13 Drawing Sheets

LASER RADAR DEVICE

CROSS-REFERENCE TO RELATED APPLICATION

This application is a U.S. application under 35 U.S.C. 111(a) and 363 that claims the benefit under 35 U.S.C. 120 from International Application No. PCT/JP2018/040195 filed on Oct. 29, 2018, the entire contents of which are incorporated herein by reference. The present application claims priority to Japanese Patent Application No. 2017-208986 filed with the Japan Patent Office on Oct. 30, 2017, the entire contents of which are incorporated herein by reference.

BACKGROUND

The present disclosure relates to a laser radar device.

A laser radar device executes various types of processing using a result of analog-digital (hereinafter referred to as AD) conversion of a received light signal. Additionally, the laser radar device needs to detect various objects at varying distances from short distance to long distance and is thus known to deal with a wide range of intensities of the received light signal. In a case where a received light signal exceeding an input range of an AD converter is input, an output from the AD converter is saturated at full scale, leading to loss of waveform information and causing a reduction in measurement accuracy.

SUMMARY

According to an aspect of the present disclosure, a laser radar device includes a branching unit, a selection unit, a conversion unit, a processing unit, a determination unit, and a control unit.

The branching unit generates, from a received light signal, a plurality of branch signals having signal intensities proportional to a signal intensity of the received light signal and different from one another and feeds the plurality of branch signals to different individual paths. The selection unit selects one of the plurality of individual paths. The conversion unit converts a signal fed via the individual path selected by the selection unit. The processing unit generates information regarding an object reflecting the pulsed optical signal in accordance with a conversion result. The determination unit determines whether a magnitude of the signal fed to the selection unit is within an input range of the conversion unit. The control unit causes the selection unit to select one of the individual paths in which the magnitude of the signal is within the input range, while providing highest gain.

DETAILED DESCRIPTION OF THE PREFERRED EMBODIMENTS

Embodiments of the present disclosure will be described below with reference to the drawings.

The inventor of the present disclosure has studied a technique for optimizing the gain without using feedback control for the following reasons.

JP 2016-178432 A discloses a technique for dividing a received light signal into a plurality of signals with different gains and appropriately selecting one of the signals to be fed to the succeeding stage.

However, the results of detailed studies of the inventor indicate that the related art described in JP 2016-178432 A has the following problems. Specifically, the related art involves executing gain control using the last input signal, in other words, executing what is called feedback control. Thus, the related art is effective in a situation where optical signals with similar intensities are consecutively received, but fails to optimize gain in a situation where optical signals with indefinite intensities are sporadically received.

An aspect of the present disclosure provides a technique for optimizing the gain without using feedback control.

According to an aspect of the present disclosure, a laser radar device includes a light emitting unit, a light receiving unit, a branching unit, a selection unit, a conversion unit, a processing unit, a determination unit, and a control unit.

The light emitting unit emits a pulsed optical signal toward a preset search region. The light receiving unit receives an optical signal arriving from the search region. The branching unit generates, from a received light signal corresponding to a current signal output by the light receiving unit, a plurality of branch signals having signal intensities proportional to a signal intensity of the received light signal and different from one another and to feed the plurality of branch signals to different individual paths. The selection unit selects one of the plurality of individual paths. The conversion unit converts, from analog to digital, a signal fed via the individual path selected by the selection unit. The processing unit generates information regarding an object reflecting the pulsed optical signal in accordance with a conversion result from the conversion unit. The determination unit determines whether a magnitude of the signal fed to the selection unit through each of the plurality of individual paths is within an input range of the conversion unit. The control unit causes the selection unit to select one of the individual paths for which the determination unit determines the magnitude of the signal to be within the input range, the one providing highest gain.

Such a configuration allows the gain of the signal fed to the conversion unit to be optimized without execution of feedback control.

1. First Embodiment

1-1. Configuration

A laser radar device 1 is mounted in a vehicle to detect various objects present around the vehicle to generate information regarding the objects.

Figure 1:
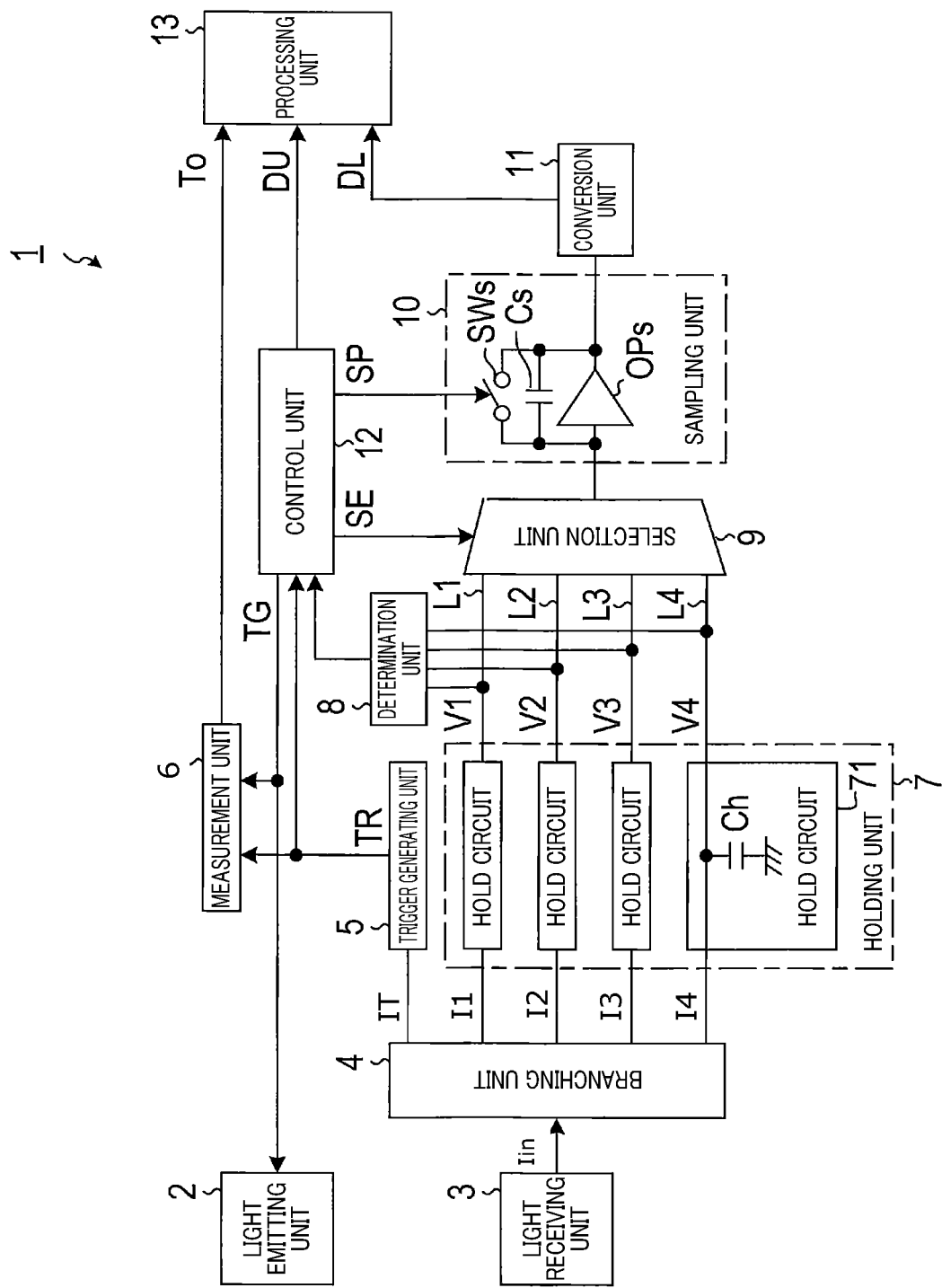
FIG. 1 is a block diagram illustrating a configuration of a laser radar device according to a first embodiment.

As illustrated in FIG. 1, a laser radar device 1 includes a light emitting unit 2, a light receiving unit 3, a branching unit 4, a trigger generating unit 5, a measurement unit 6, a holding unit 7, a determination unit 8, a selection unit 9, a sampling unit 10, a conversion unit 11, a control unit 12, and a processing unit 13.

The light emitting unit 2 includes one or more light emitting elements and emits pulsed laser light toward a preset search region in accordance with a light emission trigger signal TG from the control unit 12. The light emitting element may include, for example, a laser diode.

The light receiving unit 3 includes one or more light receiving elements, receives laser light arriving from the search region, and outputs a received light signal Iin having a current value corresponding to a received light intensity. The light receiving element includes, for example, a photodiode (that is, a PD) or an avalanche photodiode (that is, an APD). In a case where the APD is used, the APD may be what is called a Single Photo Avalanche Diode (that is, an SPAD) operating in a Geiger mode.

The branching unit 4 generates, based on the received light signal Iin from the light receiving unit 3, a plurality of branch signals I1 to I4 having different magnitudes proportional to the magnitude of the received light signal Iin, and a distance measurement signal IT. The plurality of branch signals I1 to I4 are fed to the holding unit 7, and the distance measurement signal IT is fed to the trigger generating unit 5. In this case, the number of branch signals is four but may be two or three, or five or more.

Figure 2:
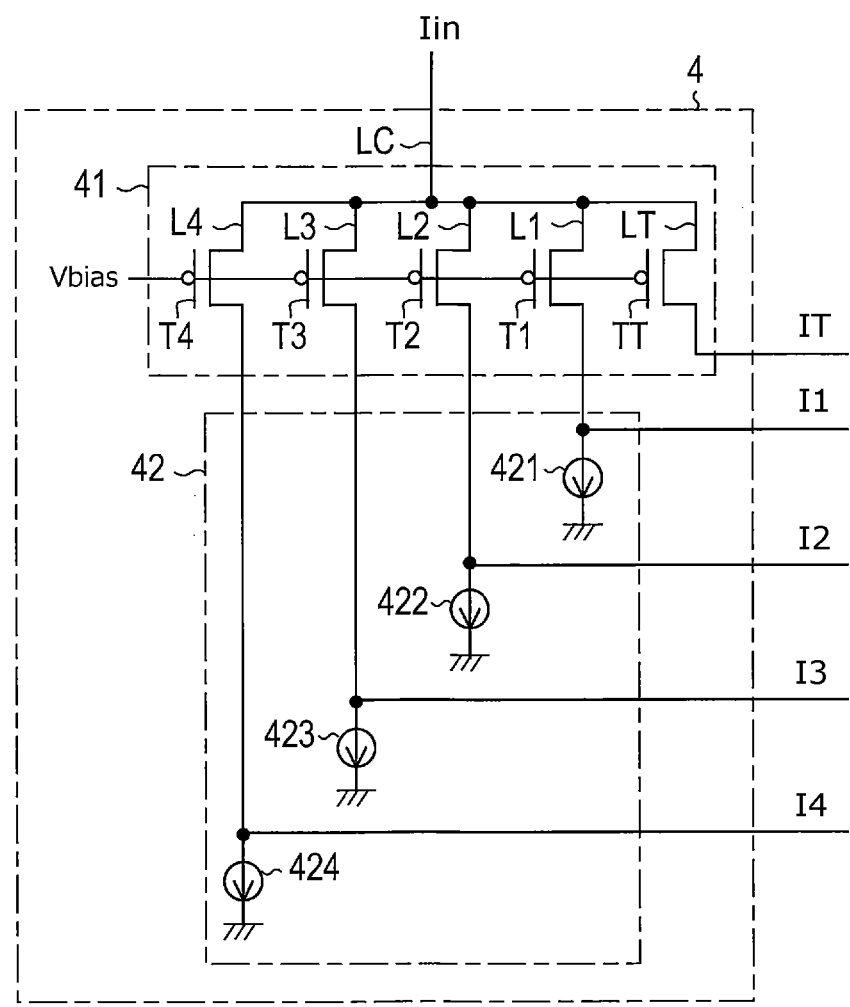
FIG. 2 is a circuit diagram illustrating a configuration of a branching unit.

Specifically, as shown in FIG. 2, the branching unit 4 includes a dividing circuit 41 and a bias eliminating circuit 42. In this case, a positive polarity signal (that is, a current source signal) is used as the received light signal Iin. However, a negative polarity signal (that is, a current sink signal) may be used as the received light signal Iin. In a case where a negative polarity signal is used, the polarity of a transistor described below needs to be inverted. Specifically, a PMOS may be changed to an NMOS, an NMOS may be changed to a PMOS, and an NMOS connected to ground may be changed to a PMOS connected to a power supply.

The dividing circuit 41 includes five individual paths LT and L1 to L4 each connected at one end to a common path LC to which the received light signal Iin is input. The individual paths LT and L1 to L4 respectively connect to transistors TT and T1 to T4. Each of the transistors TT and T1 to T4 includes a P channel MOS transistor. Each of the transistors TT and T1 to T4 includes a source connected to the common path LC and a gate to which the same bias voltage Vbias is applied. The transistor TT provided in the individual path LT includes a drain connected to the trigger generating unit 5. A current signal output from the drain of the transistor TT corresponds to the distance measurement signal IT. The other transistors T1 to T4 include drains grounded via constant current circuits 421 to 424 for bias elimination. The drain of each of the transistors T1 to T4 is also connected to the holding unit 7. Current signals output from the drains of the transistors T1 to T4 respectively correspond to the branch signals I1 to I4.

Transistor shape ratios W/L of the transistors TT and T1 to T4 are set such that the transistors TT and T1 to T4 provide different gains. W denotes a channel width, and L denotes a channel length. Here, the shape ratios W/L of the transistors TT and T1 to T4 are set to 500:500:100:10:1. In other words, the branching unit 4 divides the received light signal Iin into the distance measurement signal IT with a diversion ratio of 500/1111, the branch signal I1 with a diversion ratio of 500/1111, the branch signal I2 with a diversion ratio of 100/1111, the branch signal I3 with a diversion ratio of 10/1111, and the branch signal I4 with a diversion ratio of 1/1111 for output.

Referring back to FIG. 1, the trigger generating unit 5 generates a received light trigger signal TR indicative of a timing when the intensity of the distance measurement signal IT exceeds a preset received light threshold.

The measurement unit 6 outputs time data To obtained by measuring a time from input of the light emission trigger signal TG until input of the received light trigger signal TR. The measured time corresponds to a time required for laser light to reciprocate between the device and a target object or a value proportional to the distance to the target object. Note that the target object is an object reflecting laser light emitted from the light emitting unit 2.

The holding unit 7 includes four hold circuits 71 provided in the respective individual paths L1 to L4. Each of the hold circuits 71 includes a capacitor Ch with the same capacitance. However, the capacitances of the capacitors Ch need not necessarily be the same. The capacitor Ch is connected at one end to the individual path Li and is grounded at the other end. i denotes an integer ranging from 1 to 4. In other words, the capacitor Ch integrates a branch current Ii flowing through the individual path Li. The hold circuit 71 outputs a voltage across the capacitor Ch to the determination unit 8 and the selection unit 9 as a detection signal Vi.

The determination unit 8 determines whether signal levels of detection signals V1 to V4 output from the holding unit 7 are higher than a saturation threshold THs. In a case where an input range of the sampling unit 10 is smaller than an output level of the branching unit 4, the saturation threshold THs is set to have, for example, a magnitude approximately $4/5$ to $3/4$ of an upper limit of the input range to make a value input to the sampling unit 10 smaller than the upper limit of the input range. In a case where the input range of the sampling unit 10 is larger than the output level of the branching unit 4, the saturation threshold THs is set to have, for example, a magnitude approximately $4/5$ to $3/4$ of an upper limit of a potential to make the value input to the sampling unit 10 smaller than a preset upper limit. The input range refers to a range of input signals that can be linearly converted from analog to digital in the conversion unit 11. Additionally, the upper limit in this case refers to the upper limit of the potential at which the dividing unit 4 can linearly output an input current Iin to the holding unit 7.

Here, determination results for the detection voltages V1 to V4 are designated as H1 to H4. A determination result larger than the saturation threshold THs is represented as Hi=1, and a determination result equal to or larger than the saturation threshold THs is represented as Hi=0. For gains of the individual paths L1 to L4, the individual path L1 provides the highest gain, and the gain decreases in the order of L2, L3, and L4. Accordingly, assuming that the determination result is represented as {H1, H2, H3, H4}, the determination result is one of {0000}, {1000}, {1100}, {1110}, and {1111}.

The selection unit 9 selects one of the individual paths L1 to L4 in accordance with a selection signal SE from the control unit 12, and connects the selected individual path Li to the succeeding sampling unit 10.

The sampling unit 10 includes an operational amplifier OPs, a capacitor Cs, and a switch SWs. The capacitor Cs and the switch SWs are connected in parallel between an inversion input and an output of the operational amplifier OPs. A non-inversion input of the operational amplifier OPs is grounded.

In a case where the sampling unit 10 is brought into a standby state, the switch SWs is turned on by the sampling signal SP to clear charge from the capacitor Cs. In a case where the switch SWs is turned off by the sampling signal SP, charge stored in the capacitor Ch in the hold circuit 71 in the individual path Li selected by the selection unit 9 migrates to the capacitor Cs in the sampling unit 10, where the charge is held while the switch SWs is off. In other words, an output from the sampling unit 10 has a magnitude corresponding to a detection signal Vi for the selected individual path Li, that is, an integral value of the branch signal Ii.

The conversion unit 11 includes an AD converter converting the output from the sampling unit 10 from analog to digital. In this case, an analog signal with a signal intensity within an input range is converted into a 10-bit digital value DL.

The control unit 12 repeatedly outputs the light emission trigger signal TG at preset intervals. A period with which the light emission trigger signal TG is output is hereinafter referred to as a measurement cycle. The control unit 12 receives the received light trigger signal TR from the trigger generating unit 5 and then generates a delayed trigger signal dTR obtained by delaying the received light trigger signal TR by a preset delay time DLY. The control unit 12 generates the selection signal SE and the sampling signal SP in accordance with the delayed trigger signal dTR.

Additionally, the control unit 12 outputs the selection signal SE causing the selection unit 9 to select, in accordance with the determination result from the determination unit 8, the individual path L1 for {0000}, the individual path L2 for {0001}, the individual path L3 for {0011}, and the individual path L4 for {0111} or {1111}. Accordingly, the selection unit 9 selects one of the individual paths with the signal level determined to be equal to or smaller than the saturation threshold THs, the one providing the highest gain.

Furthermore, the control unit 12 outputs a 2-bit digital value DU to the processing unit 13 in accordance with the determination result from the determination unit 8. Specifically, the control unit 12 outputs DU=00 for the determination result {0000}, DU=01 for the determination result {0001}, DU=10 for the determination result {0011}, and DU=11 for the determination result {0111} or {1111}.

The processing unit 13 uses intensity data representing a reception intensity and distance data representing the distance to the target object to generate information regarding the object. Note that the intensity data includes an AD conversion value with a total of 12 bits including lower bits corresponding to the digital value DL from the conversion unit 11 and upper bits corresponding to the digital value DU from the control unit 12. The distance data includes the time data To from the measurement unit 6.

1-2. Operation

Figure 3:
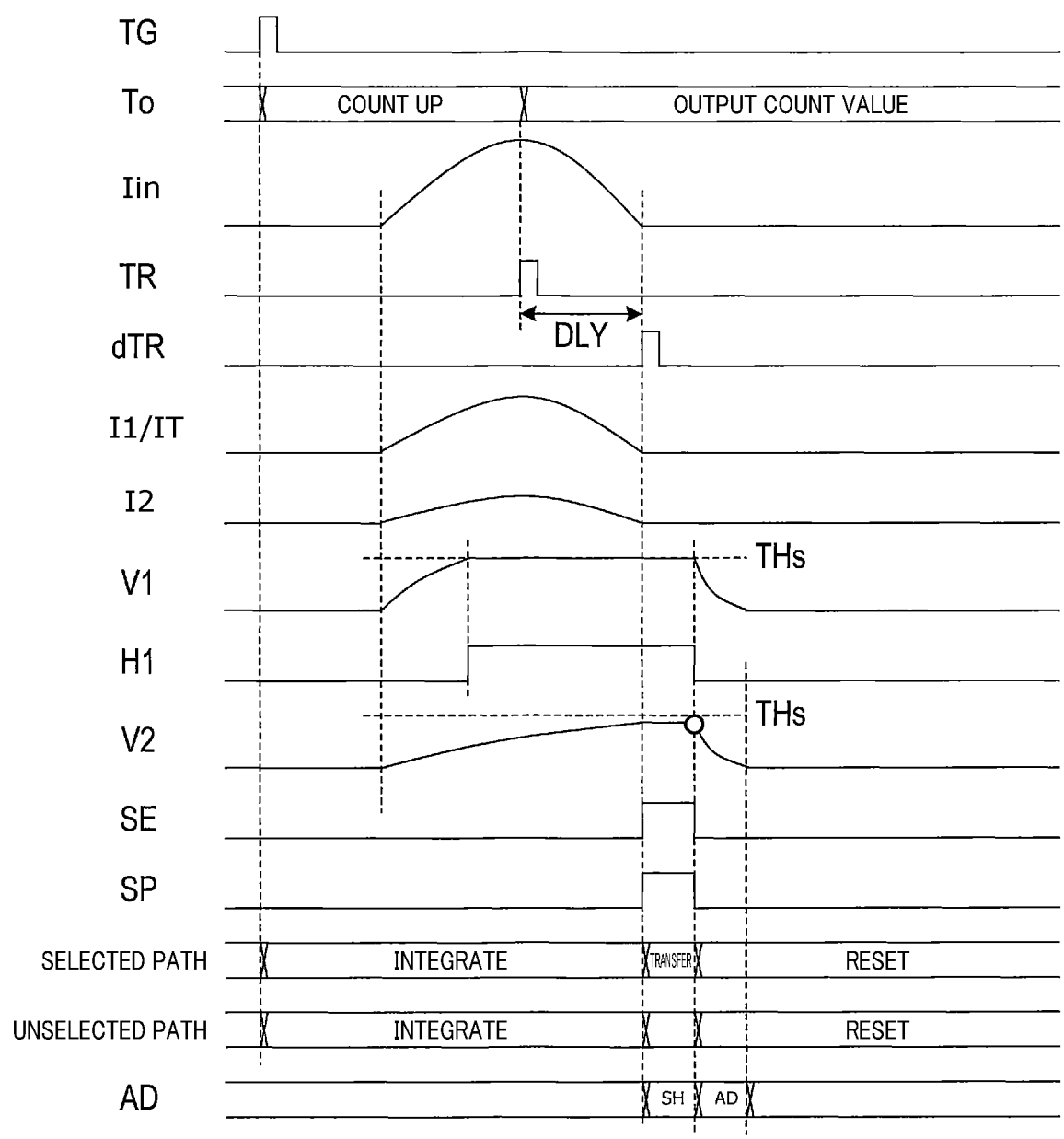
FIG. 3 is a timing diagram illustrating operations of units of the laser radar device.

With reference to FIG. 3, operations of each unit of the laser radar device 1 will be described taking, as an example, a case in which only the detection signal V1 for the individual path L1 is saturated.

In a case where the control unit 12 outputs the light emission trigger signal TG, the light emitting unit 2 emits pulsed laser light. In a case where the light receiving unit 3 receives reflected light from the target object reflecting laser light, the trigger generating unit 5 outputs the received light trigger signal TR at a timing when the signal level of the distance measurement signal IT obtained by dividing the received light signal Tin exceeds a received light threshold.

The measurement unit 6 outputs, as the time data To, a count value obtained by starting counting with a clock signal in accordance with the light emission trigger signal TG and stopping the counting in accordance with the received light trigger signal TR.

The control unit 12 delays the received light trigger signal TR to generate the delayed trigger signal dTR. The delay time DLY in this case is set, for example, equal to a length approximately half the average pulse width of the received light signal Iin.

The branch signals I1 and I2 obtained by dividing the received light signal Iin are integrated by the hold circuit 71 to generate detection signals V1 and V2. In a case where the signal level of the detection signal V1 exceeds the saturation threshold THs, the determination result H1 changes to 1.

Subsequently, the control unit 12 outputs the selection signal SE and the sampling signal SP based on the timing of the delayed trigger signal dTR. The individual path Li selected by the selection signal SE is determined in accordance with the determination result from the determination unit 8. In this case, the determination result is {1000}, and thus the individual path L2 is selected. At this time, the control unit 12 outputs, to the processing unit 13, the digital value DU corresponding to the determination result from the determination unit 8. In this case, DU=01 is output. At a timing when connection is reliably established between the sampling unit 10 and the individual path selected by the selection unit 9, the sampling signal SP is output for a period of time needed for charge transfer from the hold circuit 71 and AD conversion in the conversion unit 11.

Accordingly, after the light emission trigger signal TG is output and before the delayed trigger signal dTR is generated, the signal level of the detection signal V2, resulting from integration of the branch signal I2, is converted from analog to digital by the conversion unit 11, with the resultant digital value DL output to the processing unit 13.

Now, a relationship between the received light signal Iin and the digital value DL output by the conversion unit 11 and the digital value DU output by the control unit 12 will be described.

Figure 4:
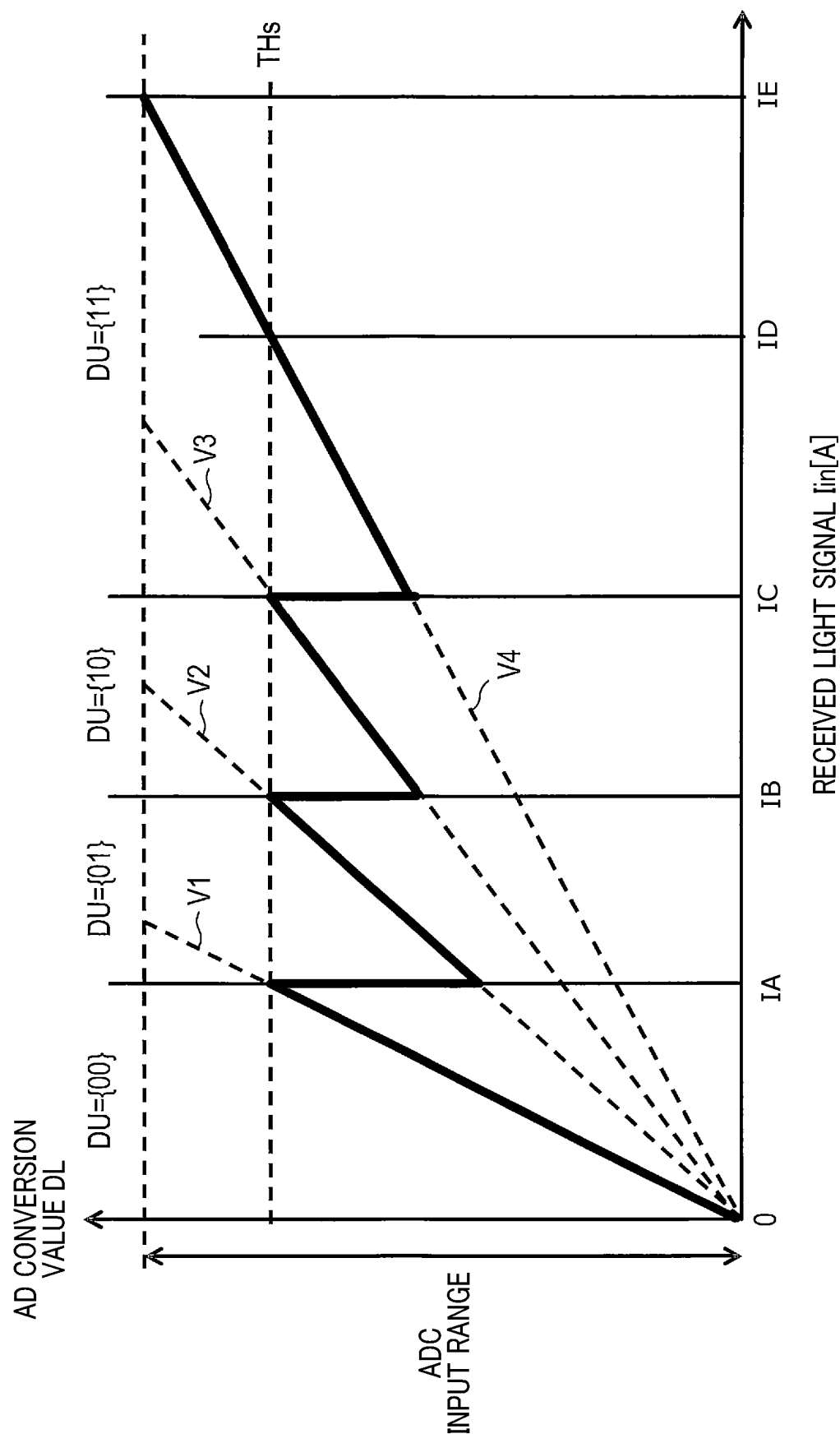
FIG. 4 is a descriptive diagram illustrating a relationship between operation of a received light signal and an AD conversion value.

As illustrated in FIG. 4, in a case where the received light signal Iin is within a range from 0 to IA [A], all of the detection signals V1 to V4 have a magnitude equal to or smaller than the saturation threshold THs, and the determination result from the determination unit 8 is {0000}. Thus, the selection unit 9 selects the individual path L1, the digital value DL output by the conversion unit 11 is a value obtained by converting the signal level of the detection signal V1 from analog to digital, and the digital value output by the control unit 12 is DU=00.

In a case where the received light signal Iin is within a range from IA to IB [A], only the detection signal V1 has a magnitude larger than the saturation threshold, and the determination result from the determination unit 8 is {1000}. Thus, the selection unit 9 selects the individual path L2, the digital value DL output by the conversion unit 11 is a value obtained by converting the signal level of the detection signal V2 from analog to digital, and the digital value output by the control unit 12 is DU=01.

In a case where the received light signal Iin is within a range from IB to IC [A], the detection signals V1 and V2 have a magnitude larger than the saturation threshold, and the determination result from the determination unit 8 is {1100}. Thus, the selection unit 9 selects the individual path L3, the digital value DL output by the conversion unit 11 is a value obtained by converting the signal level of the detection signal V3 from analog to digital, and the digital value output by the control unit 12 is DU=10.

In a case where the received light signal Iin is within a range from IC to ID [A], the detection signals V1 to V3 have a magnitude larger than the saturation threshold, and the determination result from the determination unit 8 is {1110}. Thus, the selection unit 9 selects the individual path L4, the digital value DL output by the conversion unit 11 is a value obtained by converting the signal level of the detection signal V4 from analog to digital, and the digital value output by the control unit 12 is DU=11.

In a case where the received light signal Iin is within a range from ID to IE [A], all of the detection signals V1 to V4 have a magnitude larger than the saturation threshold, and the determination result from the determination unit 8 is {1111}. Thus, the selection unit 9 selects the individual path L4, the digital value DL output by the conversion unit 11 is a value obtained by converting the signal level of the detection signal V4 from analog to digital, and the digital value output by the control unit 12 is DU=11.

1-3. Effects

The first embodiment described above in detail exhibits the following effects.

(1a) The laser radar device 1 generates, from the received light signal Tin, the plurality of branch signals I1 to I4 with different gains, and determines whether the detection signals V1 to V4 generated based on the branch signals I1 to I4 exceed the saturation threshold THs. Furthermore, the laser radar device 1 selects one of the detection signals determined to have a magnitude equal to or smaller than the saturation threshold THs, the one providing the highest gain, and converts the selected detection signal Vi from analog to digital.

Accordingly, the laser radar device 1 can optimize the gain of the signal fed to the conversion unit 11 without execution of feedback control and can convert the received light signal Iin from analog to digital, with the resultant digital signal providing the adequate gain.

(1b) The laser radar device 1 generates the digital value DU representing the upper bits of the AD conversion data, based on the determination result from the determination unit 8 used to select the detection signal Vi, which is converted from analog to digital.

Accordingly, the laser radar device 1 can provide AD conversion data having a larger bit width and being more accurate than the conversion result from the conversion unit 11. In other words, the conversion unit 11 can include an AD converter with a reduced number of bits, allowing accurate AD conversion to be inexpensively achieved.

(1c) The laser radar device 1 sets the saturation threshold THs to a value smaller than the maximum value of the input range of the conversion unit 11. Thus, even in a case where the saturation threshold THs fluctuates for some reason, the saturation threshold is prevented from exceeding the input range of the conversion unit 11, allowing suppression of generation of a miscode in the digital value DL, corresponding to the AD conversion value.

(1d) The laser radar device 1 integrates each of the plurality of branch signals I1 to I4 generated based on the received light signal Tin, and converts, only once, one of the plurality of detection signals V1 to V4 resulting from the integration from analog to digital. Accordingly, the laser radar device 1 can reduce the amount of data handled by the processing unit 13.

(1e) The laser radar device 1 allows a dynamic range of the received light signal Iin that can be handled to be easily designed based on the shape ratios of the transistors TT and T1 to T4 provided in the dividing circuit 41, the capacitance of the capacitor Ch provided in the hold circuit 71, and an integral time of the branch signals I1 to I4 (that is, the delay time DLY of the delayed trigger signal dTR. However, in view of an SN ratio, the dynamic range may be designed based on the shape ratios of the transistors or the capacitance of the capacitor.

2. Second Embodiment

2-1. Differences from First Embodiment

A second embodiment is basically similar to the first embodiment, and differences between the second embodiment and the first embodiment will be described below. Note that the same reference signs as those in the first embodiment denote the same components and that for these reference signs, refer to the above description.

In the above-described first embodiment, the hold circuit 71 of the holding unit 7 includes one capacitor. In contrast, in the second embodiment, the hold circuit 71A includes a plurality of capacitors, unlike in the first embodiment.

Figure 5:
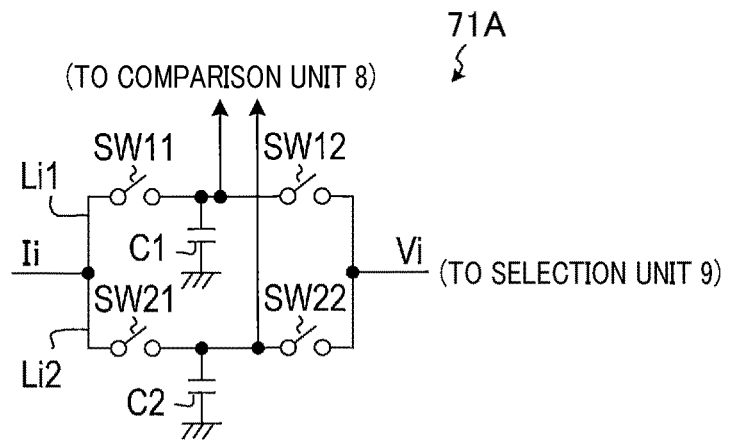
FIG. 5 is a circuit diagram illustrating a configuration of a hold circuit according to a second embodiment.

As illustrated in FIG. 5, the hold circuit 71A includes branch paths Li1 and Li2 resulting from branching of the individual path Li into two paths.

Each branch path Lij connects to a capacitor Cj and two switches SWj1 and SWj2. j=1 or 2.

The capacitor Cj is connected at one end to the branch path Lij and is grounded at the other end. The switch SWj1 is provided between the connection point of the capacitor Cj in the branch path Lij and a branch point on the side of input of the branch signal Ii. The switch SWj2 is connected between the connection point of the capacitor Cj in the branch path Lij and a branch point on the side of output of the detection signal Vi.

Additionally, the determination unit 8 is configured to be able to make determination for each of the branch paths Li1 and Li2 based on the saturation threshold THs (hereinafter referred to as saturation determination).

2-2. Operation

The switches SWj1 and SWj2 operate in accordance with instructions from the control unit 12.

(1) Operation Pattern 1

At every measurement cycle, a set of switches SW11 and SW12 and a set of switches SW21 and SW22 are turned on and off in a complementary manner.

(2) Operation Pattern 2

Figure 6:
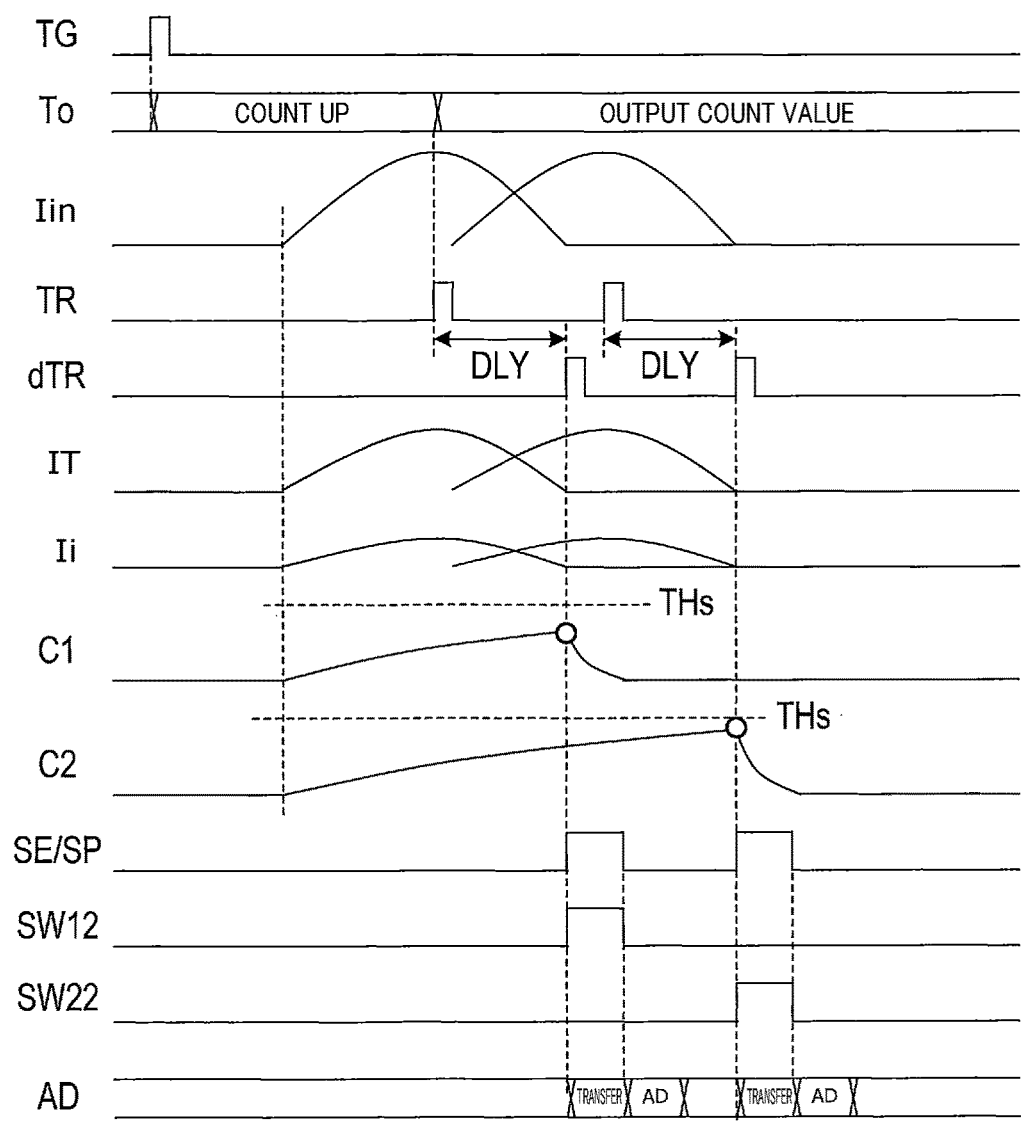
FIG. 6 is a timing diagram of a second embodiment.

In a case where a plurality of pulses may be received during one measurement cycle, the device may be operated as illustrated in FIG. 6.

Specifically, the trigger generating unit 5 generates the trigger signal TR each time the distance measurement signal IT exceeds a received light threshold. The control unit 12 generates the delayed trigger signal dTR for each trigger signal TR, and generates the selection signal SE and the sampling signal SP for each delayed trigger signal dTR.

In this case, the switch SW11 and the switch SW21 are constantly on, the switch SW12 is turned on at a timing of the first sampling signal SP, and the switch SW22 is turned on at a timing of the second sampling signal SP.

2-3. Effects

According to the second embodiment described above in detail, the effects (1a) to (1c) of the above-described first embodiment are exhibited, and the following effects are further exerted.

(2a) In the present embodiment, in a case where the device is operated in the above-described operation pattern 1, the branch path used for integration of the branch signal Ii and the branch path used for AD conversion can be alternately switched at every measurement cycle. This provides sufficient processing time allowed for AD conversion in the conversion unit 11. As a result, a slower, inexpensive AD converter can be used as the conversion unit 11.

(2b) In the present embodiment, in a case of operation in the above-described operation pattern 2, even when two pulses arrive in an overlapping manner during one measurement cycle, the pulses can be individually integrated in the two branch paths. Thus, AD conversion results for the respective pulses can be obtained.

Note that, in the present embodiment, the case of two branch paths has been described but that the number of branch paths may be three or more. Additionally, in a case of operation only in the operation pattern 2, the switches SW11 and SW21 may be omitted, and the switches SW12 and SW22 may be integrated with the selection unit 9.

3. Third Embodiment

3-1. Differences from First Embodiment

A third embodiment is basically similar to the first embodiment, and differences between the third embodiment and the first embodiment will be described below. Note that the same reference signs as those in the first embodiment denote the same components and that for these reference signs, refer to the above description.

In the third embodiment, the third embodiment differs from the first embodiment in the configuration of each of the individual circuits provided in the respective individual paths L1 to L4 in the holding unit 7.

Figure 7:
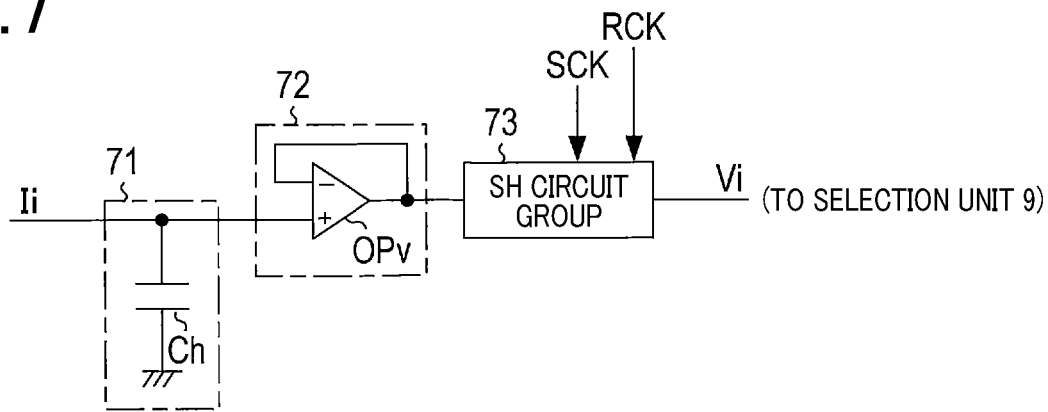
FIG. 7 is a block diagram illustrating a configuration of a circuit provided in each individual path according to a third embodiment.

As illustrated in FIG. 7, in the present embodiment, each individual path Li is provided with a voltage follower circuit 72 and a sample hold circuit group 73, in addition to the hold circuit 71.

The voltage follower circuit 72 is configured using an operational amplifier OPv and includes a non-inversion input to which an output from the hold circuit 71 is applied, and an output and an inversion input are connected together.

The sample hold circuit group 73 includes a plurality of sample hold circuits. Each sample hold circuit sequentially samples and holds outputs from the voltage follower circuit 72 in accordance with a sampling clock SCK from the control unit 12. Additionally, each sample hold circuit reads held signals in the order of sampling in accordance with a read clock RCK from the control unit 12, and outputs the signals to the selection unit 9.

3-2. Operation

Figure 8:
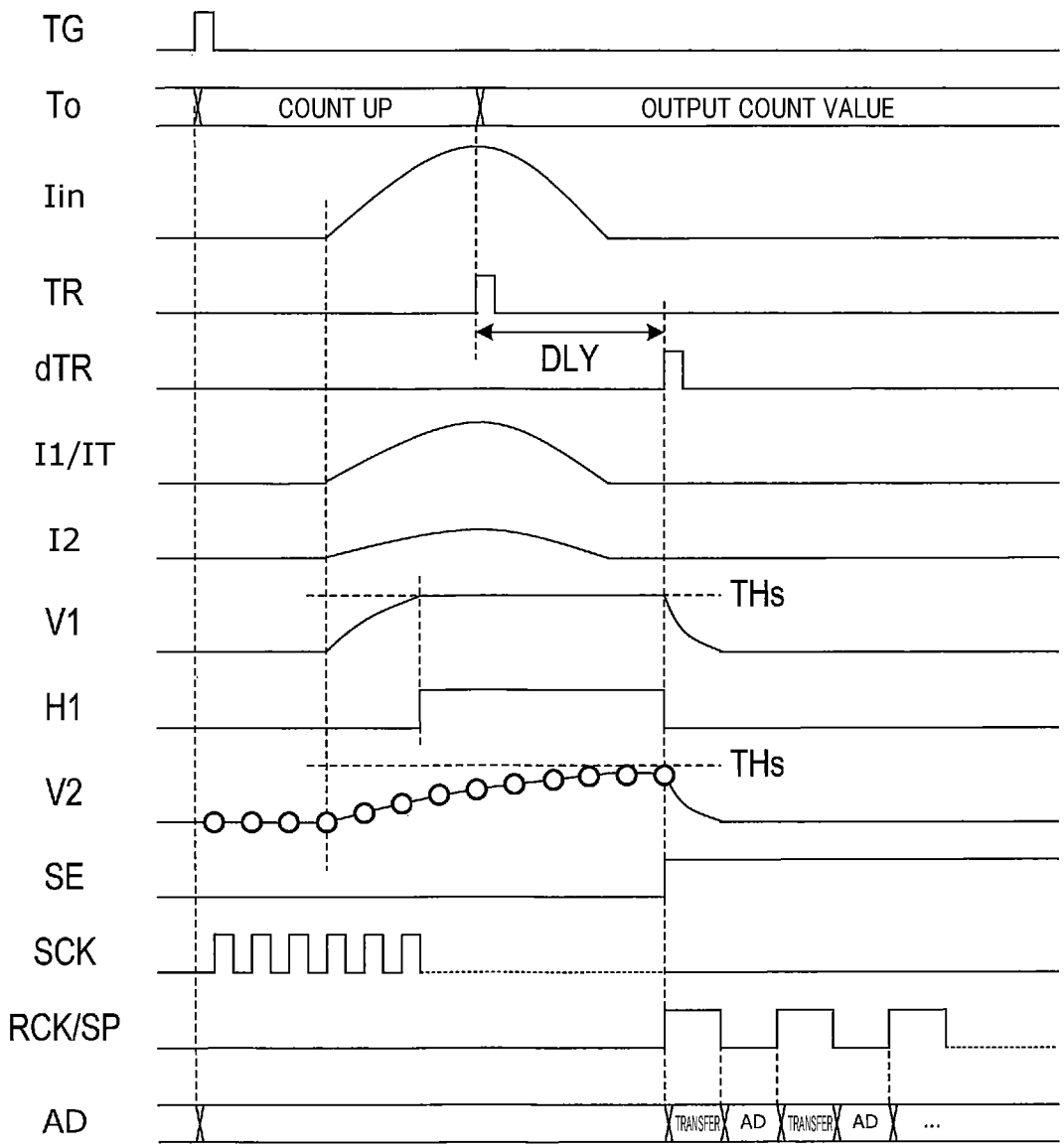
FIG. 8 is a timing diagram of a third embodiment.

In the present embodiment, as illustrated in FIG. 8, the control unit 12 outputs the sampling clock SCK from a timing of the trigger signal TR until a timing of the delayed trigger signal dTR. Accordingly, in each of the individual circuits L1 to L4, the detection signal Vi, corresponding to an output from the hold circuit 71, is sampled and held by the sample hold circuit group 73 in accordance with the sampling clock SCK.

Subsequently, the control unit 12 outputs the selection signal SE at the timing of the delayed trigger signal dTR to select one of the individual paths Li. While the individual path Li is in selection, the control unit 12 sequentially and individually reads the sampled and held values from the sample hold circuit group 73 in the individual path Li selected by outputting of the read clock RCK and the sampling signal SP, and transfers the read values to the conversion unit 11. The conversion unit 11 sequentially and individually converts the transferred signals from analog to digital to generate a plurality of digital values DL obtained by sampling the waveform of the detection signal Vi.

3-3. Effects

According to the third embodiment described above in detail, the effects (1a) to (1c) of the above-described first embodiment are exhibited, and the following effects are further exerted.

(3a) In the present embodiment, the plurality of digital values DU are obtained that represent the waveform of the detection signal Vi, thus enabling information generation with the waveform taken into account.

4. Fourth Embodiment

4-1. Differences from First Embodiment

A fourth embodiment is basically similar to the first embodiment, and differences between the fourth embodiment and the first embodiment will be described below. Note that the same reference signs as those in the first embodiment denote the same components and that for these reference signs, refer to the above description.

The fourth embodiment differs from the first embodiment in the components provided in each of the individual paths L1 to L4 in the holding unit 7.

Figure 9:
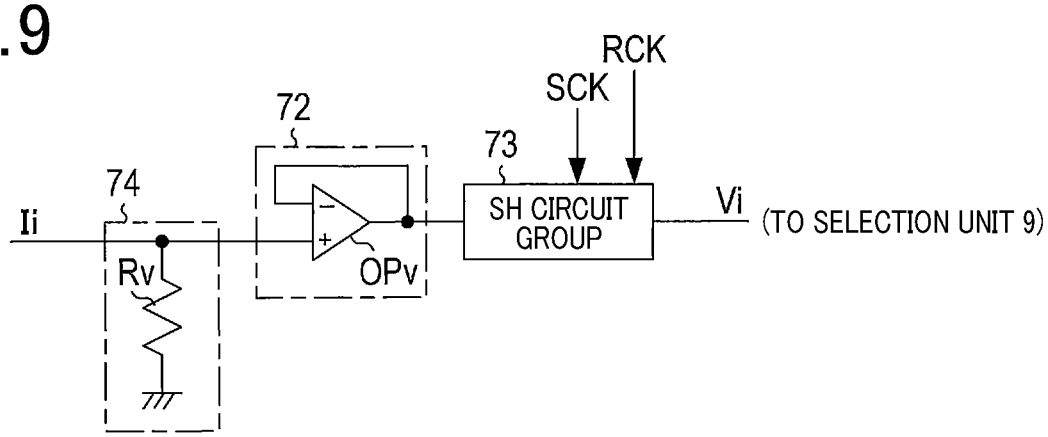
FIG. 9 is a block diagram including a circuit diagram illustrating a configuration of a circuit provided in each individual path according to a fourth embodiment.

As illustrated in FIG. 9, in the present embodiment, each individual path Li is provided with a voltage conversion circuit 74, the voltage follower circuit 72, and the sample hold circuit group 73.

In other words, compared to the third embodiment illustrated in FIG. 7, the voltage conversion circuit 74 is provided instead of the hold circuit 71.

The voltage conversion circuit 74 includes a resistor Rv connected at one end to the individual path Li and grounded at the other end. In other words, the voltage conversion circuit 74 converts the branch signal Ii into a voltage signal with the same signal waveform as that of the branch signal Ii.

4-2. Operation

Figure 10:
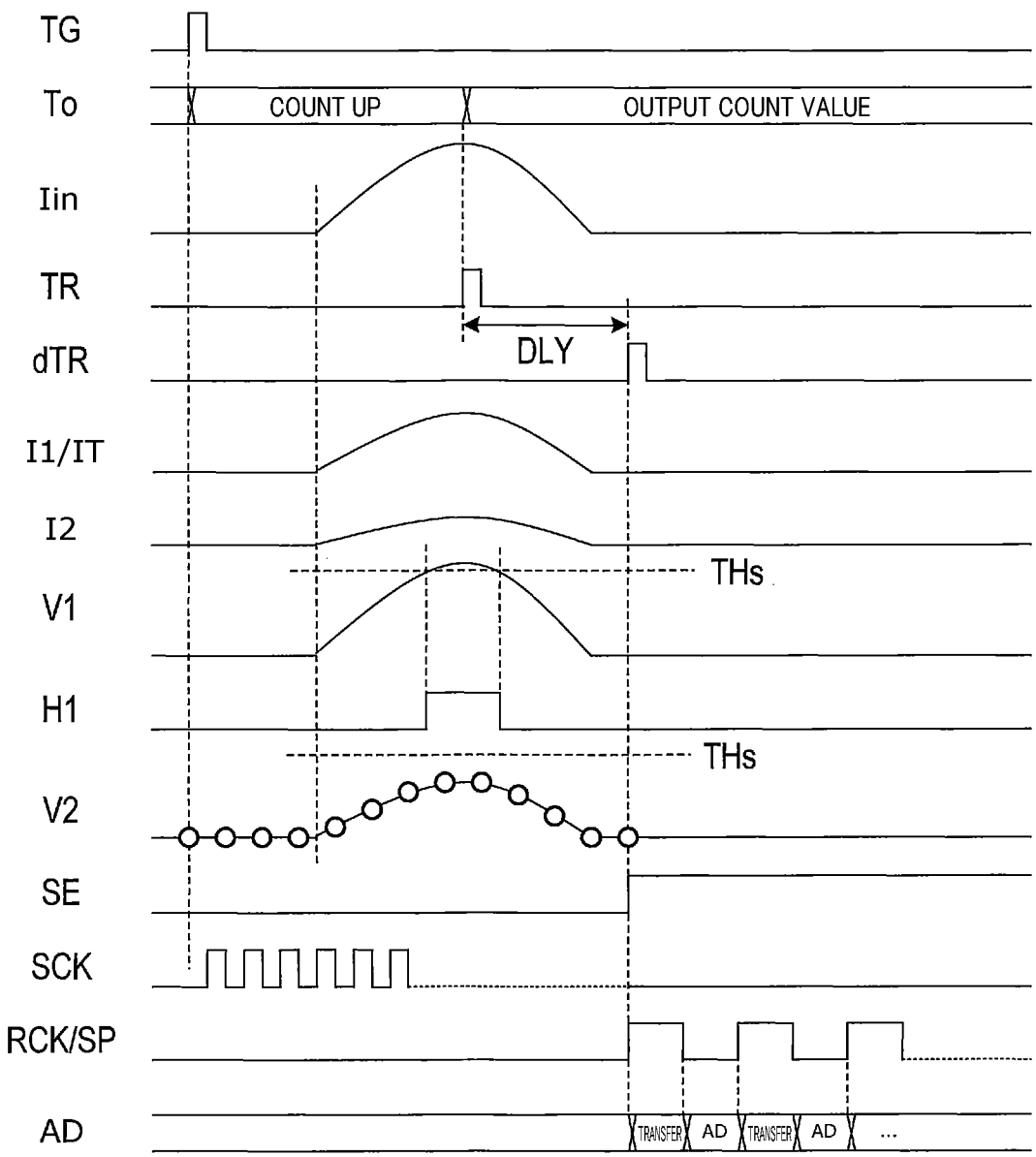
FIG. 10 is a timing diagram of a fourth embodiment.

As illustrated in FIG. 10, the operation of the control unit 12 is similar to that in the third embodiment. However, the sample hold circuit group 73 samples and holds the waveform of the branch signal Ii itself instead of the waveform of the integral value of the branch signal Ii.

4-3. Effects

According to the fourth embodiment described above in detail, the effects (1a) to (1c) of the above-described first embodiment are exhibited, and the following effects are further exerted.

(4a) In the present embodiment, the branch signal Ii, or the digital value DU representing the waveform of the received light signal Tin, can be obtained, enabling information generation with the waveform taken into account.

Note that, in the present embodiment, the voltage follower circuit 72 may be omitted.

5. Fifth Embodiment

5-1. Differences from First Embodiment

A fifth embodiment is basically similar to the first embodiment, and differences between the fifth embodiment and the first embodiment will be described below. Note that the same reference signs as those in the first embodiment denote the same components and that for these reference signs, refer to the above description.

Figure 11:
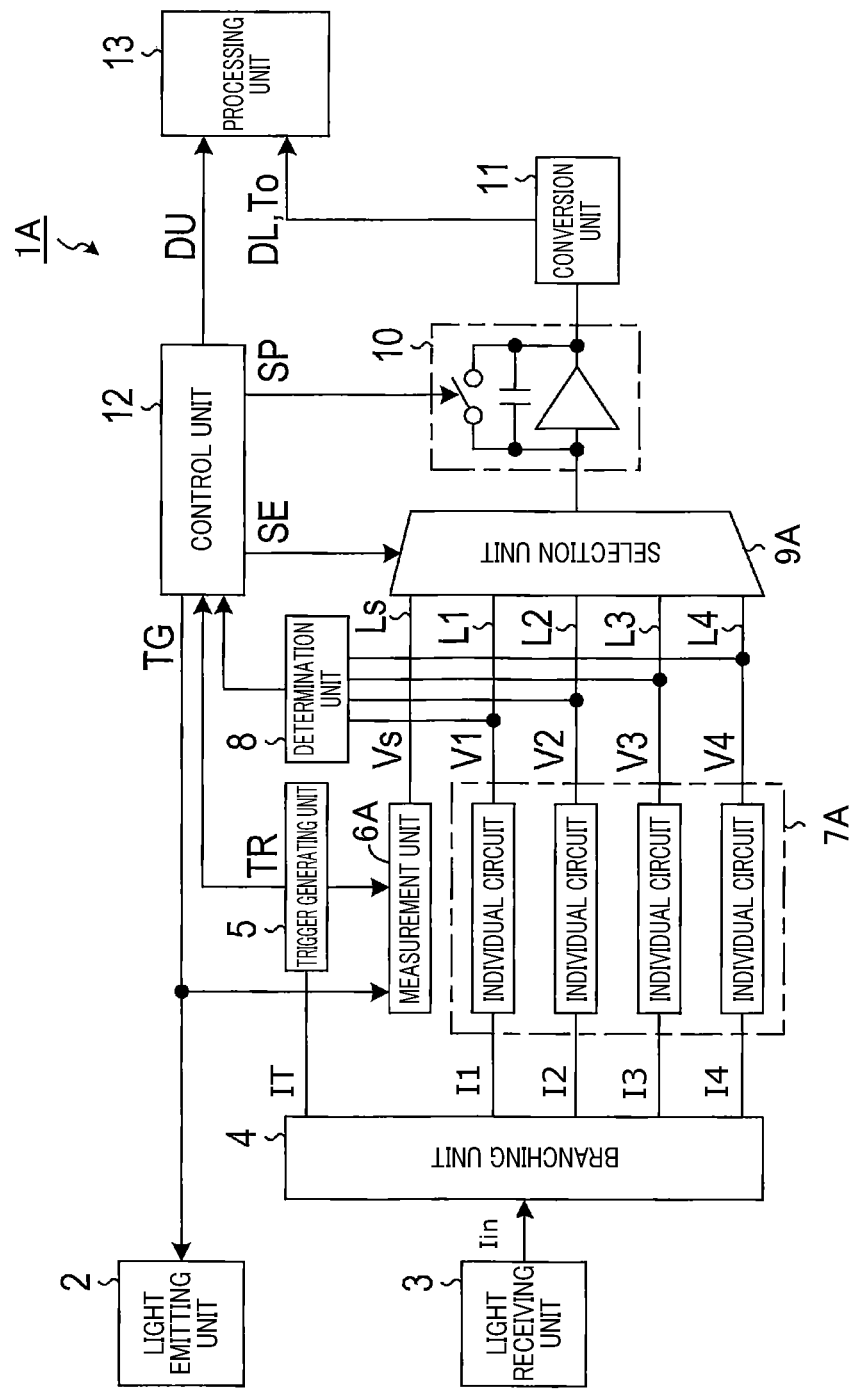
FIG. 11 is a block diagram illustrating a configuration of a laser radar device according to a fifth embodiment.

As illustrated in FIG. 11, a laser radar device 1A in the fifth embodiment differs from the laser radar device in the first embodiment in the configurations of a measurement unit 6A, a holding unit 7A, and a selection unit 9A.

The measurement unit 6A generates the detection signal VT based on the light emission trigger signal TG and the received light trigger signal TR, and feeds the detection signal VT to the selection unit 9A.

Figure 12:
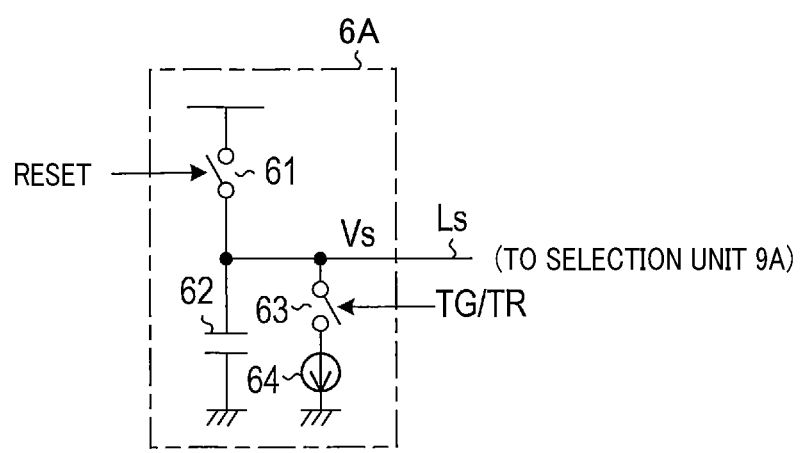
FIG. 12 is a circuit diagram illustrating a configuration of a measurement unit.

Specifically, as illustrated in FIG. 12, the measurement unit 6A includes a reset switch 61, a capacitor 62, a discharge switch 63, and a constant current circuit 64.

A power supply voltage is applied to one end of the capacitor 62 via the reset switch 61, and the other end of the capacitor 62 is grounded. The constant current circuit 64 is connected at one end to a non-grounding end of the capacitor 62 via the discharge switch 63, and is grounded at the other end. The non-grounding end of the capacitor 62 is connected to the selection unit 9A via a signal path Ls. A signal output via the signal path Ls is referred to as a detection signal Vs.

The holding unit 7A includes individual circuits in the respective individual paths L1 to L4. Each of the individual circuits may be the hold circuit 71 described in the first embodiment or the hold circuit 71A described in the second embodiment. Additionally, the individual circuit may be the combination of the hold circuit 71, the voltage follower circuit 72, and the sample hold circuit group 73 described in the third embodiment, or the combination of the voltage conversion circuit 74, the voltage follower circuit 72, and the sample hold circuit group 73 described in the fourth embodiment.

The selection unit 9A connects one of the individual paths L1 to L4 and the signal path Ls from the measurement unit 6A in accordance with the selection signal SE and connects the selected path to the sampling unit 10.

5-2. Operation

Figure 13:
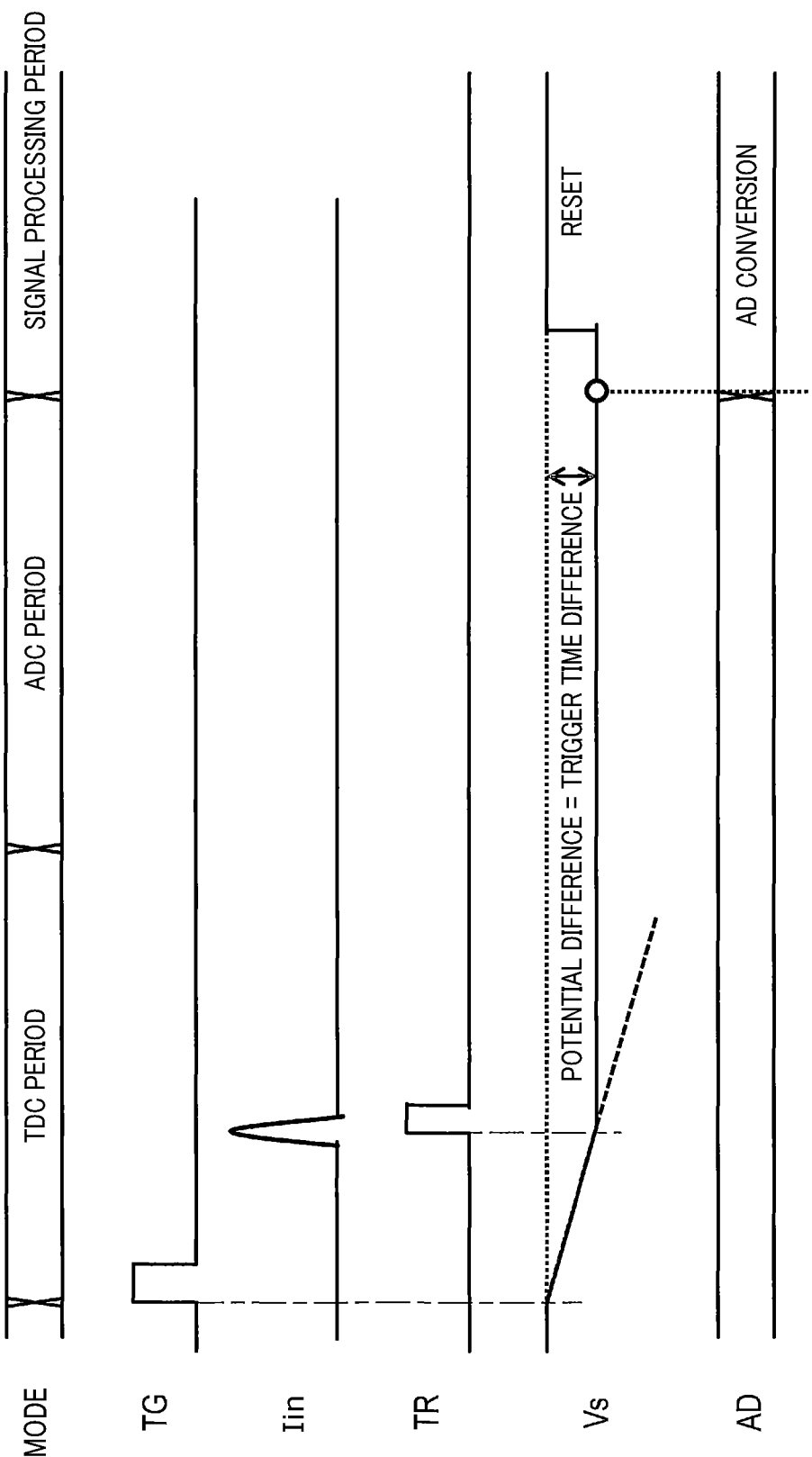
FIG. 13 is a timing diagram of a fifth embodiment.

In the present embodiment, as illustrated in FIG. 13, one measurement cycle is divided into a TDC period, an ADC period, and a signal processing period.

In a case where the light emission trigger signal TG is output, the TDC period is simultaneously started, and after the elapse of a preset time, the TDC period is switched to the ADC period, which is subsequently switched to the signal processing period. The total period of the TDC period and the ADC period is set equal to or longer than the time required for laser light to reciprocate over the maximum sensing distance of the device. The TDC period is set, for example, taking into account a distance over which a received light signal is obtained, the signal having a magnitude to be saturated even on the individual path L4 with the lowest gain. Additionally, in the measurement unit 6A, the capacitance of the capacitor 62 and a constant current value for a current from the constant current circuit 64 are set to vary voltage at a constant rate at least during the TDC period.

In the thus configured measurement unit 6A, the reset switch 61 remains on for a given period before the light emission trigger signal TG is output. Thus, the capacitor 62 is charged up to the power supply voltage.

The discharge switch 63 is turned on at the timing of the light emission trigger signal TG and is turned off at the timing of the received light trigger signal TR. In other words, the discharge of the capacitor is started at the timing of the light emission trigger signal TG, and accordingly the signal level of the detection signal Vs decreases at the given rate, and the discharge is stopped at the timing of the received light trigger signal TR. Then, the signal level of the detection signal Vs remains in the state at the time of stoppage of the discharge until the reset switch 61 is turned on again. In other words, a difference between the power supply voltage and the signal level of the detection signal Vs at the time of stoppage of the discharge has a magnitude corresponding to a time difference between the light emission trigger signal TG and the received light trigger signal TR, that is, the distance to the target object.

The holding unit 7A operates as described above in the embodiments.

In a case where the period is switched to the signal processing period, the control unit 12 selects the signal path Ls and converts the detection signal Vs from the measurement unit 6A from analog to digital. The control unit 12 then selects one of the plurality of individual paths L1 to L4 and converts the signal held in the holding unit 7A from analog to digital. Note that a result of AD conversion of the detection signal Vs is output to the processing unit 13 as time data To representing the distance to the target object.

5-3. Effects

According to the fifth embodiment described above in detail, the effects (1a) to (1c) of the above-described first embodiment are exhibited, and the following effects are further exerted.

(5a) According to the present embodiment, the detection signal Vs generated by the measurement unit 6A is converted from analog to digital using the same conversion unit 11 as that for the detection signal Vi output from the holding unit 7A, enabling a reduction in circuit area.

6. Other Embodiments

The embodiments of the present disclosure have been described. However, the present disclosure is not limited to the above-described embodiments, and various modifications can be made to the embodiments for implementation.

Figure 14:
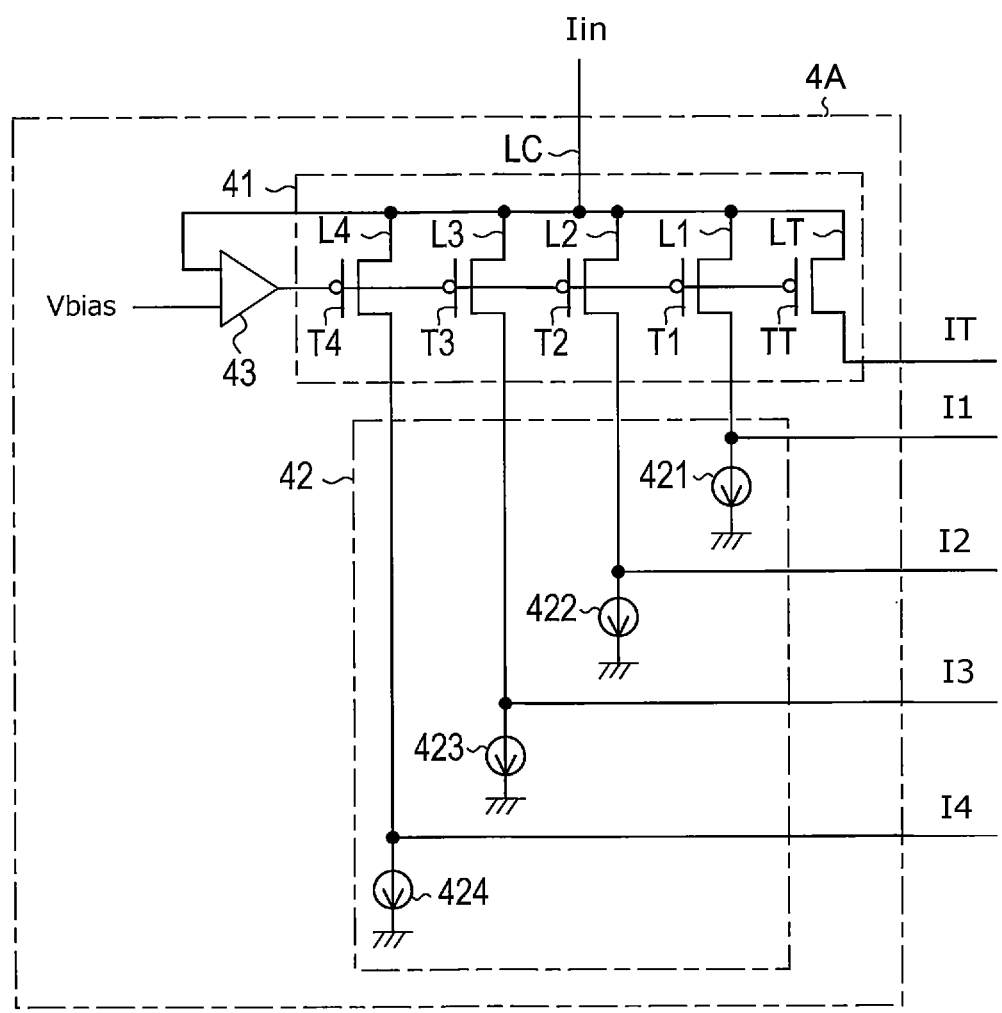
FIG. 14 is a circuit diagram illustrating a modified example of a branching unit.

(6a) In the above-described embodiments, a bias voltage Vbias is applied directly to the transistors TT and T1 to T4 provided in the dividing circuit 41. However, the present disclosure is not limited to such embodiments. For example, as in a branching unit 4A illustrated in FIG. 14, the bias voltage Vbias may be applied to the transistors TT and T1 to T4 via a regulation amplifier 43. Note that the regulation amplifier 43 may be configured using an operational amplifier and controls a control target connected to an output of the regulation amplifier 43 to make the potential of a region connected to an inversion input of the regulation amplifier 43 equal to the potential applied to a non-inversion input of the regulation amplifier 43. In a case where the regulation amplifier 43 as described above is used, an input impedance of the dividing circuit 41 can be reduced to 1/A. A represents an amplification factor for the regulation amplifier 43. As a result, an input end to which the received light signal Iin is input can be biased to an optional potential, allowing enhancement of bias controllability of a light receiving element used in the light receiving unit 3.

(6b) In the above-described embodiments, the branching unit 4 uses the dividing circuit 41 to divide the received light signal Tin to generate branch signals I1 to I4 and a distance measurement signal IT. However, the present disclosure is not limited to such embodiments. For example, the branching unit 4 may be configured using current mirror circuits 46 and 49 as in branching units 4B and 4C illustrated in FIG. 15 and FIG. 16.

Figure 15:
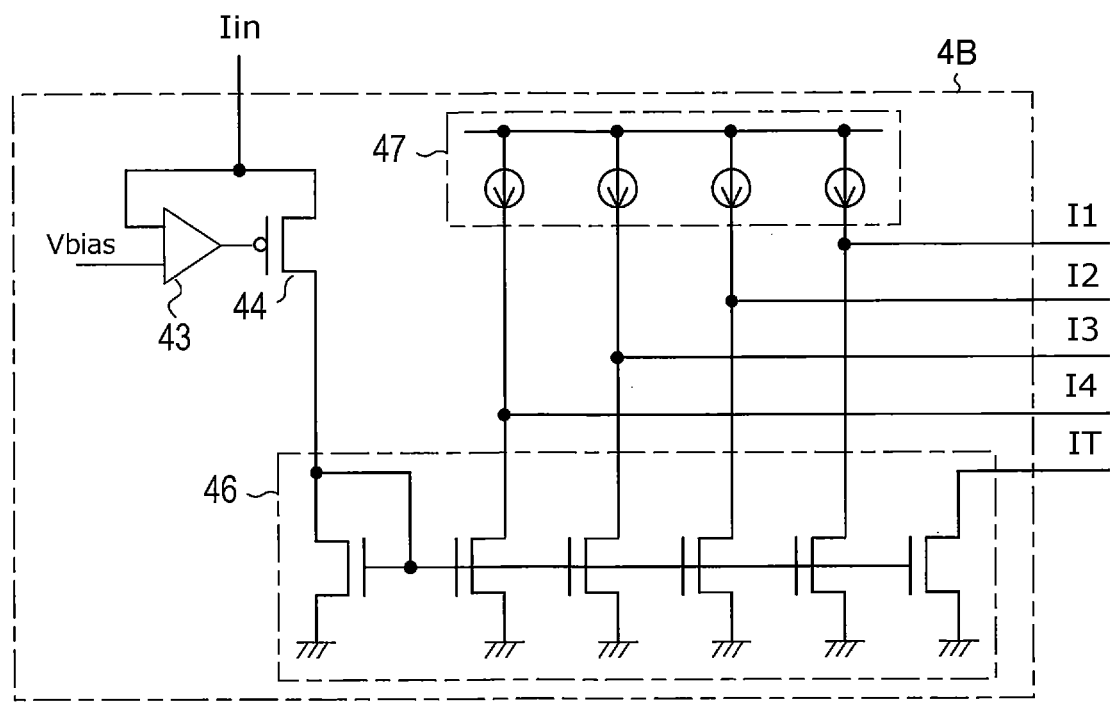
FIG. 15 is a circuit diagram illustrating a modified example of the branching unit.

The branching unit 4B illustrated in FIG. 15 includes the regulation amplifier 43, a transistor 44, the current mirror circuit 46, and a bias eliminating circuit 47. The transistor 44 includes a source to which the received light signal Iin is applied and a gate to which the bias voltage Vbias is applied via the regulation amplifier 43. The current mirror circuit 46 generates branch signals I1 to I4 and a distance measurement signal IT that are proportional to the received light signal Iin fed via the transistor 44. The bias eliminating circuit 47 includes constant current circuits connected to respective four transistors generating branch signals I1 to I4 in the current mirror circuit 46. The functions of the bias eliminating circuit 47 are similar to the functions of the bias eliminating circuit 42.

Figure 16:
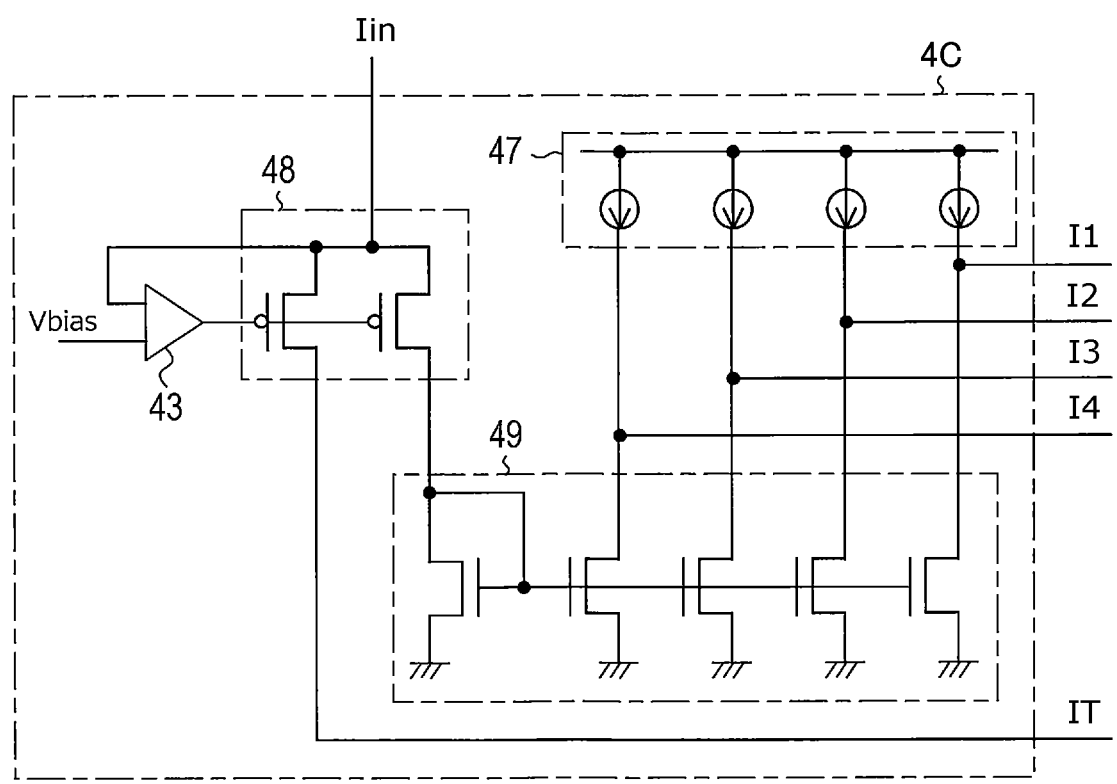
FIG. 16 is a circuit diagram illustrating a modified example of the branching unit.

Additionally, a branching unit 4C illustrated in FIG. 16 includes the regulation amplifier 43, a dividing circuit 48, the current mirror circuit 49, and the bias eliminating circuit 47.

The dividing circuit 48 includes two transistors each including a source to which the received light signal Iin is applied and a gate to which to which the bias voltage Vbias is applied via the regulation amplifier 43. A current signal flowing through a drain of one of the transistors is output as the distance measurement signal IT, and a current signal flowing through a drain of the other transistor is fed to the current mirror circuit. The current mirror circuit 49 generates branch signals I1 to I4 proportional to the current signal fed from the dividing circuit 48.

(6c) A plurality of functions of one component in the above-described embodiments may be implemented by a plurality of components or one function of one component may be implemented by a plurality of components. Additionally, a plurality of functions of a plurality of components may be implemented by one component or one function may be implemented by a plurality of component may be implemented by one component. In addition, some of the components of the above-described embodiments may be omitted. Additionally, at least some of the components of any of the above-described embodiments may be added to or replace the components of another of the above-described embodiments.

(6d) Besides the above-described laser radar device, various forms such as a system including the laser radar device as a component and a gain setting method can be used to implement the present disclosure.

What is claimed is:

1. A laser radar device comprising:
a light emitting unit configured to emit a pulsed optical signal toward a preset search region;
a light receiving unit configured to receive an optical signal arriving from the search region;
a branching unit configured to generate, from a received light signal corresponding to a current signal output by the light receiving unit, a plurality of branch signals having signal intensities proportional to a signal intensity of the received light signal and different from one another and to feed the plurality of branch signals to different individual paths;
a selection unit configured to select one of the plurality of individual paths;
a conversion unit configured to convert, from analog to digital, a signal fed via the individual path selected by the selection unit;
a processing unit configured to generate information regarding an object reflecting the pulsed optical signal in accordance with a conversion result from the conversion unit;
a determination unit configured to determine whether a magnitude of the signal fed to the selection unit through each of the plurality of individual paths is within an input range of the conversion unit; and
a control unit configured to cause the selection unit to select one of the individual paths for which the determination unit determines that the magnitude of the signal is within the input range and which provides a highest gain.

2. The laser radar device according to claim 1, wherein the branching unit is configured to generate the plurality of branch signals from the received light signal using a current mirror circuit.

3. The laser radar device according to claim 1, wherein the branching unit is configured to generate the branch signal by using a dividing circuit including a plurality of transistors connected in parallel and to which an identical bias voltage is applied, the transistors having different amplification factors, to divide the received light signal.

4. The laser radar device according to claim 3, wherein the branching unit is configured to feed the bias voltage to the dividing circuit via a regulation amplifier.

5. The laser radar device according to claim 1, wherein each of the plurality of individual paths is provided with a hold circuit configured to integrate the branch signal flowing through the individual path.

6. The laser radar device according to claim 5, wherein each of the plurality of individual paths is further provided with a sample hold circuit group including a plurality of sample hold circuits configured to sample and hold an output from the hold circuit at different timings, and
the control unit is configured to operate the sample hold circuit group to sequentially individually read values held in the plurality of sample hold circuits provided in the individual path selected by the selection unit and to feed the read values to the selection unit.

7. The laser radar device according to claim 1, wherein each of the plurality of individual paths is further provided with:
a voltage conversion circuit configured to convert the branch signal to a voltage signal; and
a sample hold circuit group including a plurality of sample hold circuits configured to sample and hold the voltage signal output from the voltage conversion circuit at different timings, and
the control unit is configured to operate the sample hold circuit group to sequentially individually read values held in the plurality of sample hold circuits provided in the individual path selected by the selection unit and to feed the read values to the selection unit.

8. The laser radar device according to claim 6, wherein each of the plurality of individual paths is further provided with a voltage follower circuit located to precede the plurality of sample hold circuits.

9. The laser radar device according to claim 1, wherein the determination unit is configured to use a saturation threshold set to a value smaller than an upper limit of the input range of the conversion unit, to determine whether the magnitude of the signal is within the input range.

10. The laser radar device according to claim 1, wherein the control unit is configured to generate, from a determination result from the determination unit, upper bits corresponding to a conversion result from the conversion unit.

11. The laser radar device according to claim 1, further comprising:
a measurement unit using one of the branch signals generated by the branching unit to generate a measurement value corresponding to a time from a timing of light emission of the optical signal by the light emitting unit until a timing of reception of the optical signal by the light receiving unit.

12. The laser radar device according to claim 11, wherein the measurement unit is configured to provide, as the measurement value, a voltage across a capacitor charged with a given voltage, the voltage across the capacitor being obtained by discharging the capacitor at a given rate during a period from the timing of light emission until the timing of light reception, and
the measurement value generated by the measurement unit is fed to the conversion unit via the selection unit and converted from analog to digital by the conversion unit.

* * * * *